(12) United States Patent
Roessner et al.

(10) Patent No.: US 7,858,514 B2
(45) Date of Patent: Dec. 28, 2010

(54) INTEGRATED CIRCUIT, INTERMEDIATE STRUCTURE AND A METHOD OF FABRICATING A SEMICONDUCTOR STRUCTURE

(75) Inventors: Ulrike Roessner, Dresden (DE); Daniel Koehler, Chemnitz (DE); Ilona Juergensen, Dresden (DE); Mirko Vogt, Dresden (DE)

(73) Assignee: Qimonda AG, Munich (DE)

( * ) Notice: Subject to any disclaimer, the term of this patent is extended or adjusted under 35 U.S.C. 154(b) by 424 days.

(21) Appl. No.: 11/771,558

(22) Filed: Jun. 29, 2007

(65) Prior Publication Data

US 2009/0001595 A1 Jan. 1, 2009

(51) Int. Cl.
*H01L 21/4763* (2006.01)
(52) U.S. Cl. ........................ 438/627; 438/700; 438/682
(58) Field of Classification Search ........................ None
See application file for complete search history.

(56) References Cited

U.S. PATENT DOCUMENTS

| 5,121,184 | A | * | 6/1992 | Huang et al. ................. 257/588 |
| 5,883,575 | A | * | 3/1999 | Ruby et al. ............... 340/572.5 |
| 5,889,389 | A | * | 3/1999 | Bothra et al. ................ 320/166 |
| 6,127,811 | A | * | 10/2000 | Shenoy et al. ............... 320/166 |
| 6,146,543 | A | * | 11/2000 | Tai et al. ........................ 216/2 |
| 6,197,644 | B1 | * | 3/2001 | Gardner et al. .............. 438/279 |
| 6,271,087 | B1 | * | 8/2001 | Kinoshita et al. ........... 438/258 |
| 6,378,996 | B1 | * | 4/2002 | Shimada et al. ............... 347/70 |
| 6,573,030 | B1 | | 6/2003 | Fairbairn et al. |
| 6,750,127 | B1 | | 6/2004 | Chang et al. |
| 6,841,341 | B2 | | 1/2005 | Fairbairn et al. |
| 6,900,002 | B1 | | 5/2005 | Plat et al. |
| 6,913,958 | B1 | | 7/2005 | Plat et al. |
| 6,989,332 | B1 | | 1/2006 | Bell et al. |
| 7,033,960 | B1 | | 4/2006 | You et al. |
| 7,084,071 | B1 | | 8/2006 | Dakshina-Murthy et al. |
| 7,109,101 | B1 | | 9/2006 | Wright et al. |
| 7,575,990 | B2 | * | 8/2009 | Wei ............................ 438/586 |
| 2002/0096738 | A1 | * | 7/2002 | Prinslow et al. ............. 257/532 |
| 2002/0111025 | A1 | * | 8/2002 | Weybright et al. .......... 438/689 |
| 2003/0021004 | A1 | * | 1/2003 | Cunningham et al. ....... 359/290 |
| 2003/0024902 | A1 | * | 2/2003 | Li et al. ........................ 216/67 |
| 2003/0045114 | A1 | * | 3/2003 | Ni et al. ...................... 438/710 |
| 2003/0119307 | A1 | | 6/2003 | Bekiaris et al. |
| 2004/0038537 | A1 | | 2/2004 | Liu et al. |
| 2004/0061227 | A1 | | 4/2004 | Gao et al. |
| 2004/0259355 | A1 | | 12/2004 | Yin et al. |
| 2005/0009268 | A1 | * | 1/2005 | Cheng et al. ................ 438/249 |
| 2005/0048222 | A1 | | 3/2005 | Ruelke et al. |
| 2005/0136675 | A1 | | 6/2005 | Sandhu et al. |
| 2005/0164479 | A1 | * | 7/2005 | Perng et al. ................. 438/591 |
| 2005/0167394 | A1 | | 8/2005 | Liu et al. |
| 2005/0167839 | A1 | | 8/2005 | Wetzel et al. |
| 2005/0239002 | A1 | | 10/2005 | Li |

(Continued)

FOREIGN PATENT DOCUMENTS

EP 1 154 468 A2 11/2001

(Continued)

*Primary Examiner*—David E Graybill (57) ABSTRACT

In a method of fabricating a semiconductor structure, a carbon containing mask is fabricated over a dielectric layer. The mask exposes the surface of the dielectric layer at least partly in a region between two adjacent conducting lines. A contact hole is etched into the dielectric layer in the region between the two adjacent conducting lines.

28 Claims, 7 Drawing Sheets

U.S. PATENT DOCUMENTS

| | | | |
|---|---|---|---|
| 2006/0011583 A1* | 1/2006 | Bailey et al. | 216/67 |
| 2006/0024945 A1 | 2/2006 | Kim et al. | |
| 2006/0105578 A1* | 5/2006 | Hong et al. | 438/723 |
| 2006/0205207 A1* | 9/2006 | Chen et al. | 438/638 |
| 2006/0289385 A1* | 12/2006 | Kikuchi | 216/67 |
| 2007/0210339 A1* | 9/2007 | Narasimhan et al. | 257/213 |
| 2008/0044980 A1* | 2/2008 | Wilson et al. | 438/424 |
| 2008/0061340 A1* | 3/2008 | Heineck et al. | 257/301 |
| 2008/0076230 A1* | 3/2008 | Cheng et al. | 438/386 |
| 2009/0001595 A1* | 1/2009 | Roessner et al. | 257/773 |
| 2010/0032805 A1* | 2/2010 | Letertre et al. | 257/615 |

FOREIGN PATENT DOCUMENTS

| | | |
|---|---|---|
| JP | 2005-045053 A | 2/2005 |
| WO | WO 0245134 A2 * | 6/2002 |

\* cited by examiner

INTEGRATED CIRCUIT, INTERMEDIATE STRUCTURE AND A METHOD OF FABRICATING A SEMICONDUCTOR STRUCTURE

TECHNICAL FIELD

The invention relates to a method of fabricating a semiconductor structure.

BACKGROUND

In the fabrication of semiconductor devices, it is sometimes desirable to etch a contact hole between two adjacent conducting regions. The etch step may cause significant problems. For example, if the conducting regions are exposed during the etch step the functionality of the semiconductor structure may be impaired.

SUMMARY OF THE INVENTION

An embodiment of the invention relates to a method of fabricating a semiconductor structure. A carbon containing mask is fabricated over a dielectric layer. The mask exposes the surface of the dielectric layer at least partly in a region between two adjacent conducting lines. A contact hole is etched into the dielectric layer in the region between the two adjacent conducting lines. The method according to this aspect of the invention uses a carbon containing mask that reduces the risk of exposing the conducting lines during the etch step.

A further embodiment of the invention presents a method of providing a contact element between two adjacent conducting regions. A cover stack is deposited over the conducting regions. The cover stack includes a dielectric layer and a carbon containing mask layer on top of the dielectric layer. The mask layer has an opening, which vertical projection overlaps with both conducting regions. A contact hole is etched through the mask layer into the dielectric layer.

A further embodiment of the invention provides a semiconductor device comprising a semiconductor structure that is fabricated by forming a carbon containing mask layer over a dielectric layer. The mask exposes the surface of the dielectric layer at least partly in a region between two adjacent conducting lines. A contact hole is etched into the dielectric layer in the region between the two adjacent conducting lines.

Furthermore, an embodiment of the invention provides a semiconductor device that includes a semiconductor structure that is fabricated by: fabricating at least two adjacent conducting lines. The two adjacent conducting lines are covered with a protection liner. A dielectric layer is formed over the protection liner. A carbon containing mask is formed over the dielectric layer. The mask exposes the surface of the dielectric layer at least partly in a region between the two adjacent conducting lines. A contact hole is etched into the dielectric layer and into the protection liner in the region between the two adjacent conducting lines.

Further, an embodiment of the invention provides an intermediate structure on a semiconductor substrate. Two conductive regions are laterally separated by a gap region. A dielectric layer covers the conductive region. A carbon hard mask layer is disposed onto the dielectric layer. An opening extends through the hard mask layer and the dielectric layer down to the semiconductor substrate. The opening includes an upper portion above the conductive region and a lower portion located in the gap region, wherein the vertical projection of the upper region overlaps with the conductive regions.

BRIEF DESCRIPTION OF THE DRAWINGS

In order that the manner in which the above-recited and other details of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF ILLUSTRATIVE EMBODIMENTS

Embodiments of the present invention will be best understood by reference to the drawings, wherein like parts are designated by like numerals throughout.

It will be readily understood that the process steps of the present invention, as generally described and illustrated in the figures herein, could vary in a wide range of different process steps. Thus, the following more detailed description of the exemplary embodiments of the present invention, as represented in FIGS. 1-14 is not intended to limit the scope of the invention, as claimed, but is merely representative of a presently preferred embodiment of the invention. Further, details described with respect to one embodiment can also be applied to other embodiments.

Figure 1:
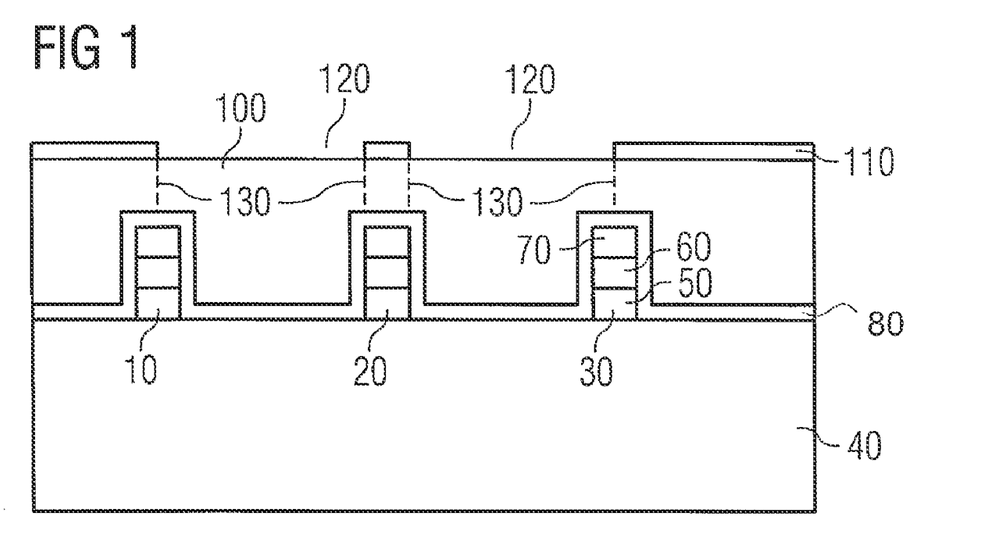
FIGS. 1-4 show a first preferred embodiment of the invention.

In FIG. 1, adjacent conducting regions or lines 10, 20 and 30 are fabricated over (e.g., on top of) a substrate 40. According to this embodiment, each conducting region includes two conductive layers 50 and 60 and a protective cap 70. The protective cap 70 may comprise at least one material of the material group comprising silicon nitride, silicon oxynitride and silicon carbide. In one example, the conductors 10, 20 and 30 must be gate conductors (e.g., wordlines) for transistor devices. In another embodiment, the conductors 10, 20, 30 may be interconnects such as bitlines.

The conducting regions 10, 20 and 30 are preferably covered by a protection liner 80 that may contain or consist of silicon nitride.

Then, a cover stack is fabricated over the conducting regions 10, 20 and 30. The cover stack comprises a dielectric layer 100 that has a higher etch rate than the protection liner 80, and a carbon containing mask layer 110 thereon. The mask layer 110 has openings 120. Their vertical projections 130 may overlap with the conducting regions 10, 20 and 30.

The carbon containing mask layer 110 may be a hard mask comprising carbon material or consisting of carbon material. For example, the carbon containing mask layer 110 consists of amorphous carbon (containing traces of hydrogen and nitrogen) or pyrolytic carbon.

Figure 2:
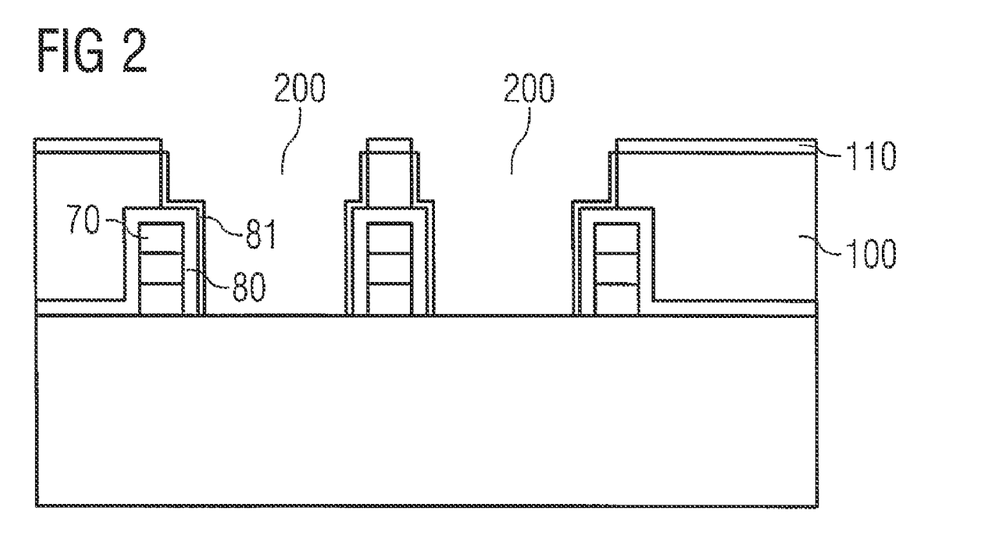
Figure 3:
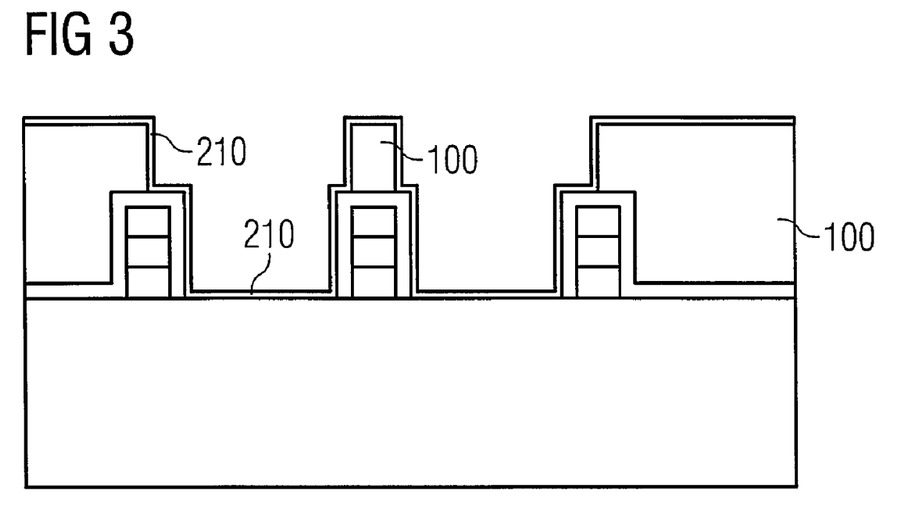

In FIG. 2, the resulting structure is shown after etching contact holes 200 into the dielectric layer 100. The conducting regions 10, 20 and 30 are protected by their protective caps 70 and by the protection liner 80 and by an additional protection layer 81 arising from the carbon containing mask 110. This layer 81 may be removed at the end of the contact hole etch process. Therefore, the conductive layers 50 and 60 are not exposed during this etch step.

Thereafter, the contact holes 200 may be filled with a conducting material such as polysilicon and/or tungsten and/or AlCu and/or copper. Before filling the contact holes 200 a conductive liner 210 may be deposited. The conductive liner may comprise at least one material of the group containing titanium, TiN, TiSi, Ta, TaN, WN, copper and CoSi (see FIG. 3).

Figure 4:
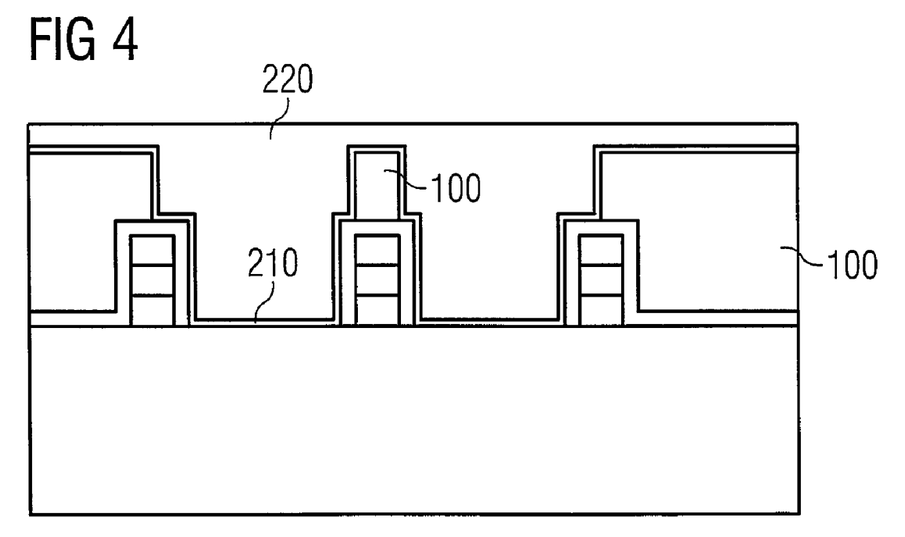

FIG. 4 shows the resulting structure after filling the contact holes 200 with the conducting material 220.

Figure 5:
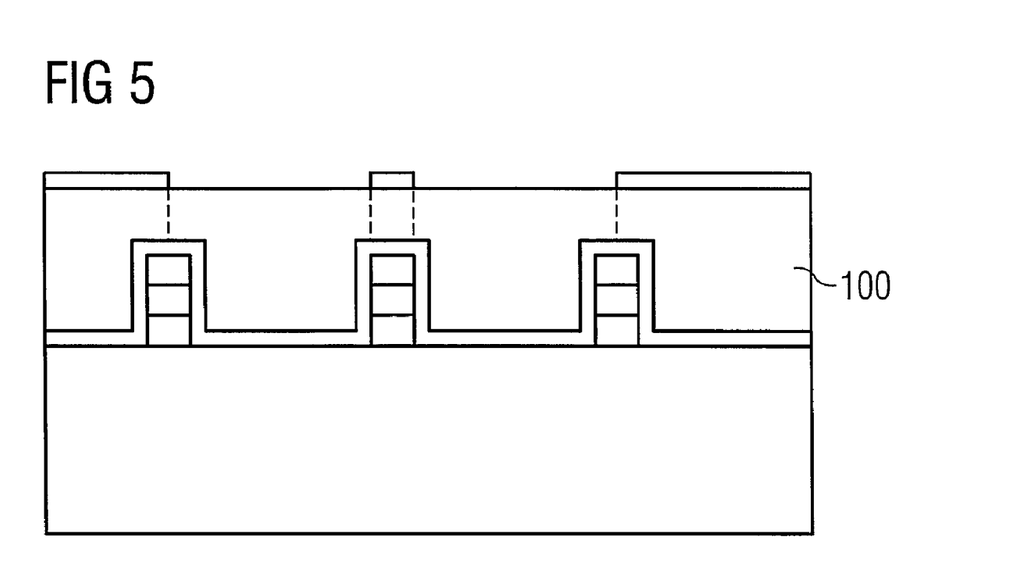
FIGS. 5-7 show a second preferred embodiment of the invention.
Figure 6:
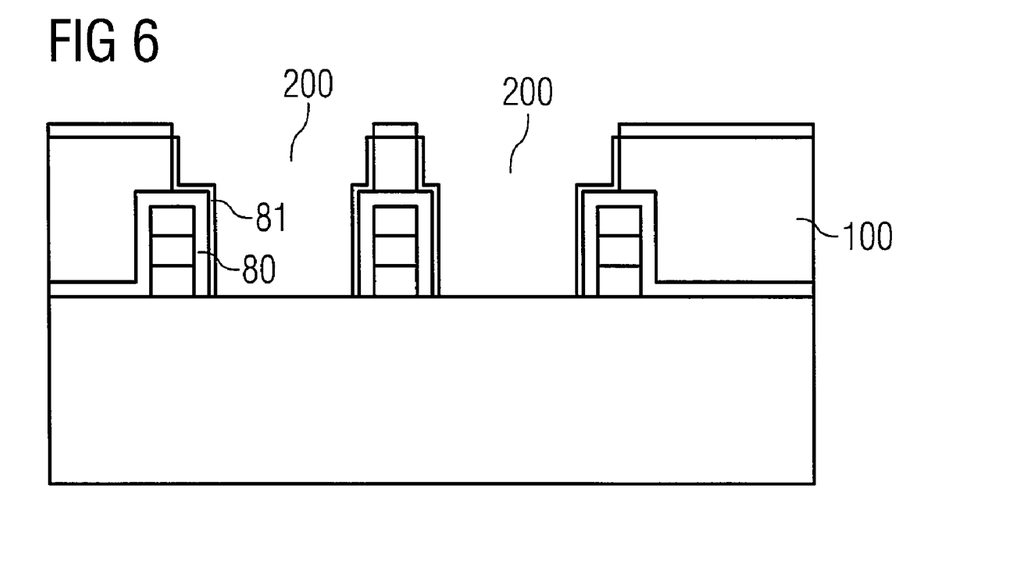
Figure 7:
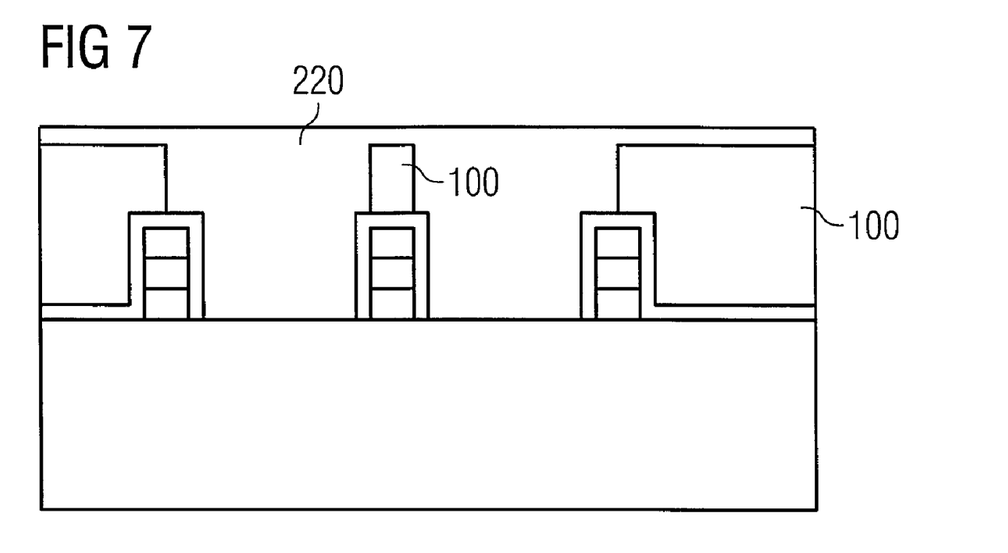

FIGS. 5-7 show a further embodiment of the invention where the liner 210 is omitted. After etching the contact holes 200 (FIG. 6), they are filled with the conducting material 220 (FIG. 7).

Figure 8:
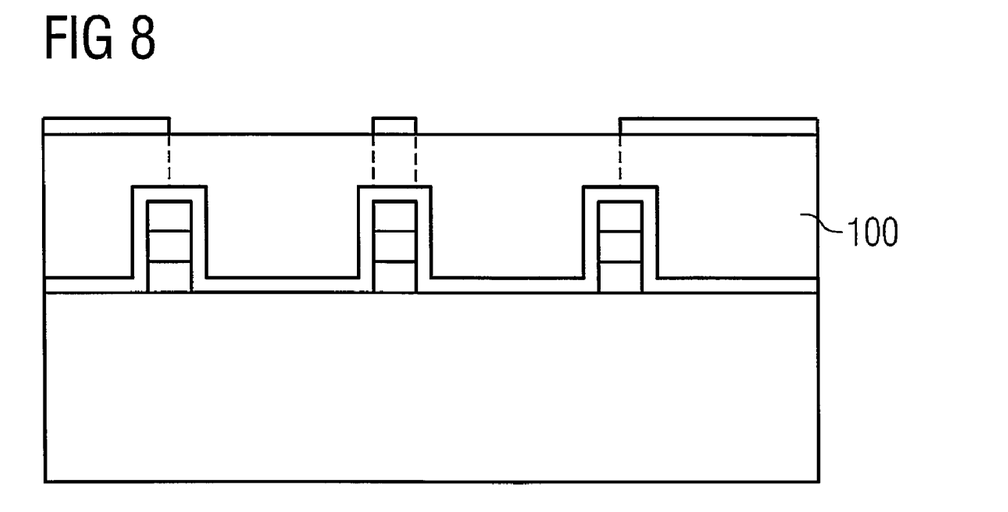
FIGS. 8-10 show a third preferred embodiment of the invention.
Figure 9:
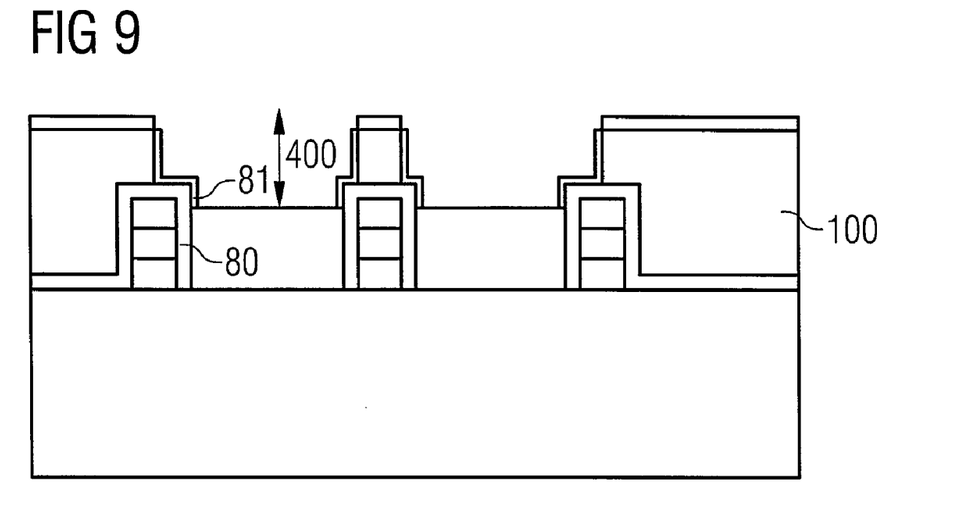
Figure 10:
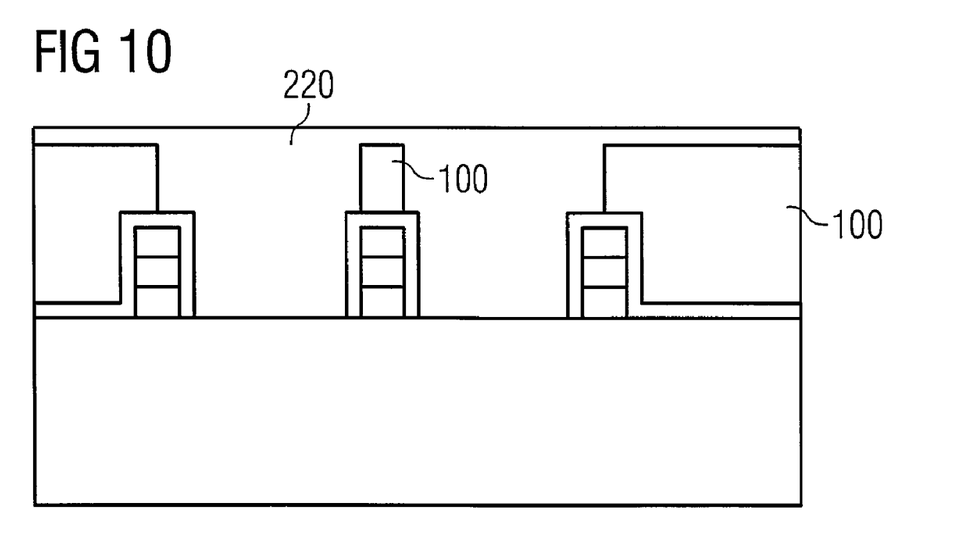

FIGS. 8-10 show another embodiment of the invention in which etching of the dielectric layer 100 comprises a first etch step and at least a consecutive second etch step, which differs from the first etch step.

The first etch step may be terminated when the etch depth 400 has reached or passed the height of the upper surface of the conducting lines 10, 20 and 30 (FIG. 9). The first etch step and the second etch step may be carried out using plasma. Preferably, the plasma that is applied during the second etch step, comprises a higher oxygen concentration than those during the first etch step.

Furthermore, the plasma that is applied during the second etch step may comprise an additional $C_xF_y$ plasma component such as $C_4F_6$ which is absent or present at a lower concentration during the first etch step. During the first and second etch steps, a carbon containing film comprising material of the carbon containing mask 110 is deposited (e.g., by sputtering) onto the protection liner 80 which leads to the additional protection layer 81 on top the protection liner 80. This additional protection liner may be removed at the end of the contact hole etch process.

FIG. 10 shows the resulting semiconductor device or the intermediate structure after filling the contact holes with the conducting material 220.

Figure 11:
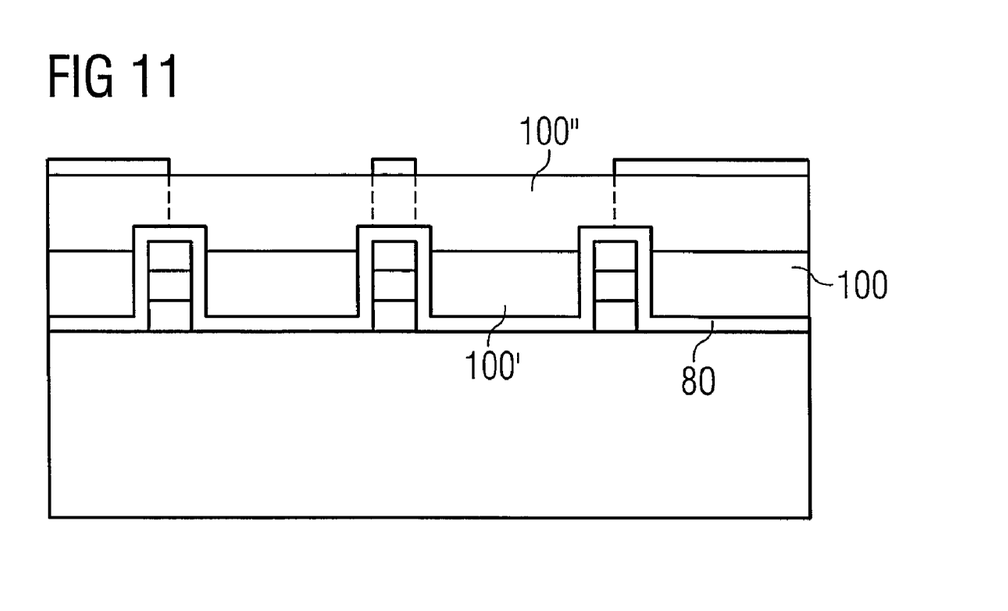
FIGS. 11-14 show a fourth preferred embodiment of the invention.
Figure 12:
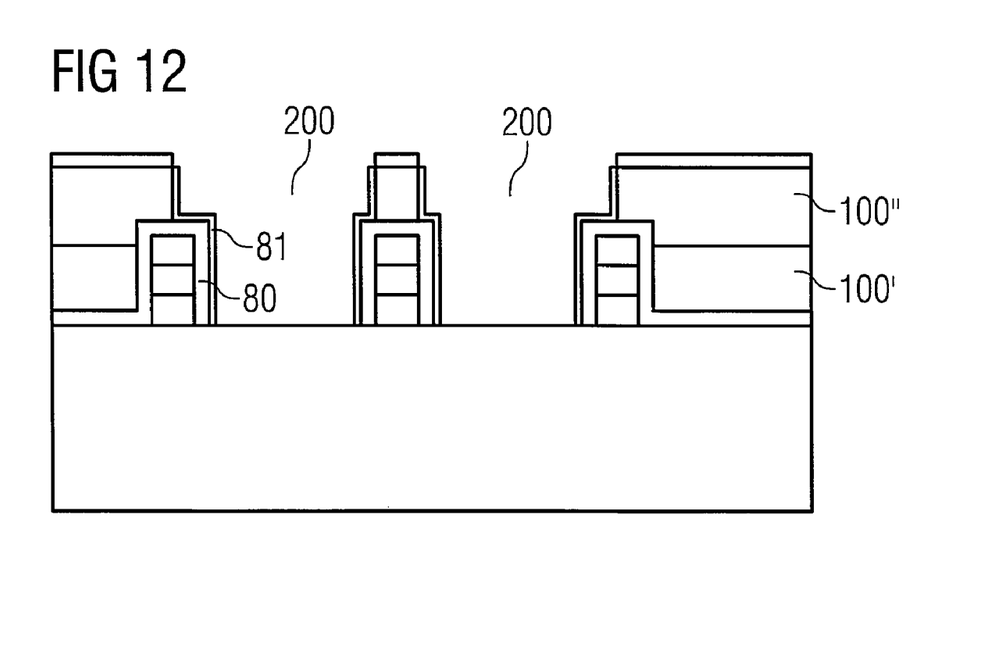
Figure 13:
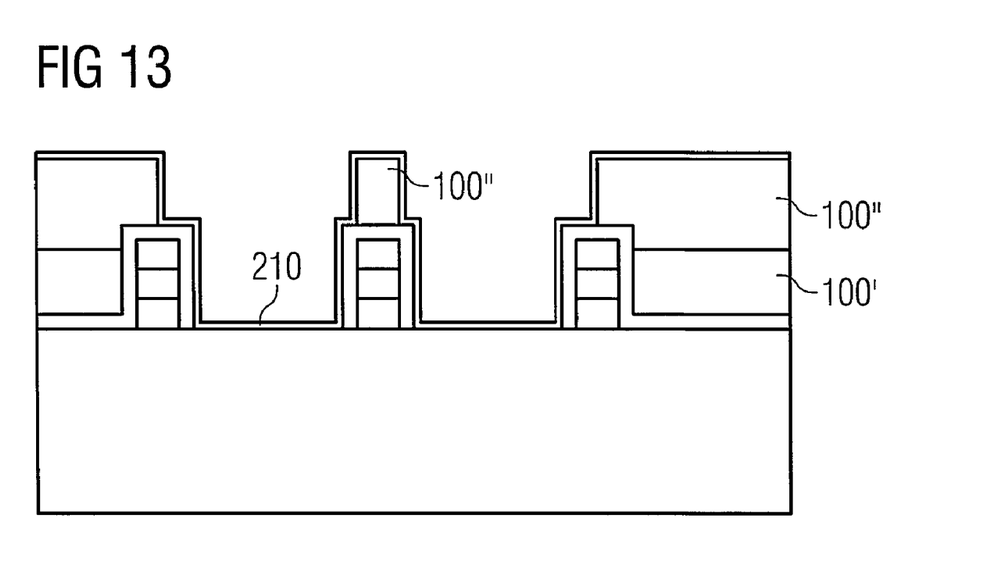

FIGS. 11-13 show another embodiment of the invention in which fabricating the dielectric layer 100 on top of the protection liner 80 comprises depositing two different layers with significantly different etch rates. The layer with the lower etch rate is fabricated above the other layer. For example, the lower dielectric layer 100' is made of SOD (spin-on-dielectric)-material (for voidfree fill) and the upper dielectric layer 100" is made of PSG (phosphor doped glass)-material (and works as a getter layer).

The lower and the upper dielectric layers 100' and 100" may be etched during the same etch step as discussed above (FIGS. 1-7), or during two different etch steps as discussed above (FIGS. 8-10). FIG. 12 shows the structure after etching the contact holes 200.

Thereafter, a conductive liner 210 may be deposited. The conductive liner may comprise at least one material of the group containing titanium, TiN, Ta, TaN, WN, copper and cobalt (see FIG. 13). Of course, the conductive liner 210 is not mandatory.

Figure 14:
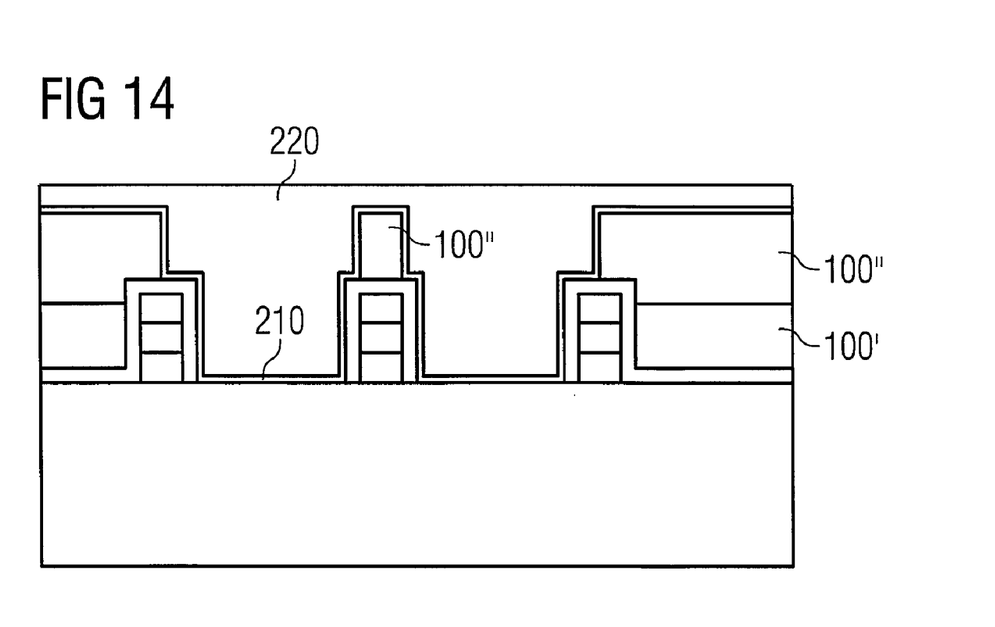

Then, the contact holes 200 are filled with a conducting material 220 such as polysilicon and/or tungsten and/or AlCu and/or copper. FIG. 14 shows the resulting structure after filling the contact holes 200 with the conducting material 220.

In any of the embodiments, the conducting material 220 may be thinned, e.g., by a chemical mechanical polish, so that the conductors between adjacent conductors 10, 20 and 30 are electrically isolated. In other embodiments, the conductors may remain electrically connected, e.g., to create the bitline of a memory device.

What is claimed is:

1. A method of fabricating a semiconductor structure, the method comprising:
   fabricating a carbon containing mask over a dielectric layer, the mask exposing a surface of the dielectric layer at least partly in a region between two adjacent conducting lines; and
   etching a hole into the dielectric layer in the region between the two adjacent conducting lines, wherein etching a hole into the dielectric layer comprises performing a first etch step on the dielectric layer by a first etching process and then performing a second etch step on the dielectric layer by a second etching process different from the first etching process; and;
   wherein the first etch step is terminated when an etch depth has reached or passed a height of an upper surface of the adjacent conducting lines.

2. The method of claim 1, wherein the first etch step and the second etch step are carried out by applying plasma.

3. The method of claim 2, wherein the plasma applied during the first etch step has a first oxygen concentration and the plasma applied during the second etch step has a second oxygen concentration higher than the first oxygen concentration.

4. The method of claim 2, wherein the plasma applied during the second etch step has an additional $C_xF_y$ plasma component that is absent from the plasma applied during the first etch step.

5. The method of claim 4, wherein the additional $C_xF_y$ plasma component comprises $C_4F_6$.

6. A method of fabricating a semiconductor structure, the method comprising:
   fabricating at least two adjacent conducting lines;
   covering the two adjacent conducting lines with a protection liner;
   fabricating a dielectric layer over the protection liner;
   fabricating a carbon containing mask over the dielectric layer, the mask forming a mask opening exposing a surface of the dielectric layer at least partly in a region between the two adjacent conducting lines; and
   etching a contact hole into the dielectric layer in the region between the two adjacent, conducting lines, wherein etching the dielectric layer comprises performing a first etch step by a first etching process and then performing a second etch step by a second etching process different from the first etching process, wherein the first etch step and the second etch step are carried out by applying plasma, and wherein a carbon containing film is formed by material of the carbon containing mask being deposited directly onto the protection liner during the etching step.

7. The method of claim 6, wherein a diameter of the mask opening of the carbon containing mask is wider than a distance between the two adjacent conducting lines such that the protection liner over the adjacent conducting lines is exposed when the contact hole is etched.

8. The method of claim 6, wherein the first etch step is terminated when a depth of the etch has reached or passed a height of an upper surface of the adjacent conducting lines.

9. The method of claim 6, wherein the plasma applied during the first etch step has a first oxygen concentration and the plasma applied during the second etch step has a second oxygen concentration higher than the first oxygen concentration.

10. The method of claim 6, wherein the plasma applied during the second etch step has an additional $C_xF_y$ plasma component that is absent from the plasma applied during the first etch step.

11. The method of claim 10, wherein the additional $C_xF_y$ plasma component comprises $C_4F_6$.

12. The method of claim 6, further comprising, after performing the first etch step and the second etch step, the step of performing a removal step comprising removing the carbon containing film.

13. The method of claim 6, wherein fabricating the dielectric layer over the protection liner comprises first fabricating a lower dielectric layer having a first etch rate and then fabricating an upper dielectric layer having a second etch rate lower than the first etch rate.

14. The method of claim 13, wherein at least one of the upper and lower dielectric layers is made of a material comprising an oxide.

15. The method of claim 13, wherein the upper dielectric layer is formed from phosphor-doped glass and the lower dielectric layer is formed from spin-on-dielectric material.

16. The method of claim 13, wherein the protection liner is formed from a material comprising silicon nitride.

17. The method of claim 16, wherein the conducting lines are fabricated so as to be a conducting line stack comprising a dielectric top layer.

18. The method of claim 17, wherein the dielectric top layer comprises silicon nitride.

19. The method of claim 6, further comprising the step of filling the contact hole with a conducting material.

20. The method of claim 19, further comprising the step of depositing a liner before filling the contact hole.

21. The method of claim 20, wherein the liner comprises at least one material selected from the group consisting of titanium, TiN, TiSi, Ta, TaN, WN, copper and CoSio.

22. The method of claim 19, wherein the conducting material comprises at least one material selected from the group consisting of polysilicon, tungsten, AlCu and copper.

23. A method of providing a contact element between two adjacent conducting regions, the method comprising:
   depositing a cover stack onto the conducting regions, the cover stack sequentially comprising a protective liner, a dielectric layer over the protective liner and a carbon containing mask layer over the dielectric layer, the mask layer having an opening such that a vertical projection of the mask layer overlaps with both conducting regions;
   etching a contact hole through the mask layer into the dielectric layer;
   lining the contact hole with an electrically conductive liner; and
   filling the contact hole at least partially with a conductive material separate from the electrically conductive liner, wherein the conducting regions are isolated from the electrically conductive liner by the protective liner.

24. The method of claim 23, wherein the contact hole vertically extends at least to a bottom of the conducting regions.

25. The method of claim 23, wherein the conducting region comprises a capping layer and wherein the dielectric material of the capping layer comprises at least one material selected from the group consisting of silicon nitride, silicon oxynitride and silicon carbide.

26. The method of claim 23, wherein the conductive regions form either bitlines or wordlines.

27. The method of claim 23, wherein the carbon containing layer comprises a carbon hard mask.

28. The method of claim 23, wherein the electrically conductive liner is selected from the group consisting of TiN, TiSi, Ta, TaN, WN, copper and CoSio.

* * * * *